(12) United States Patent
Ogura et al.

(10) Patent No.: US 11,227,928 B1
(45) Date of Patent: Jan. 18, 2022

(54) TERMINATION STRUCTURES FOR TRENCH-GATE FIELD-EFFECT TRANSISTORS

(71) Applicant: SEMICONDUCTOR COMPONENTS INDUSTRIES, LLC, Phoenix, AZ (US)

(72) Inventors: Takashi Ogura, Oizumi-machi (JP); Takashi Hiroshima, Ota (JP); Toshimitsu Taniguchi, Aizuwakamatsu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/948,793

(22) Filed: Oct. 1, 2020

Related U.S. Application Data

(60) Provisional application No. 62/705,646, filed on Jul. 9, 2020.

(51) Int. Cl.
*H01L 29/423* (2006.01)
*H01L 29/10* (2006.01)
*H01L 29/66* (2006.01)
*H01L 29/40* (2006.01)

(52) U.S. Cl.
CPC .... *H01L 29/42368* (2013.01); *H01L 29/1095* (2013.01); *H01L 29/4236* (2013.01); *H01L 29/4238* (2013.01); *H01L 29/404* (2013.01); *H01L 29/6656* (2013.01)

(58) Field of Classification Search
CPC ........... H01L 29/42368; H01L 29/4238; H01L 29/6656; H01L 29/404; H01L 29/7813; H01L 29/4236; H01L 29/1095; H01L 29/7802
See application file for complete search history.

(56) References Cited

U.S. PATENT DOCUMENTS

| | | | |
|---|---|---|---|
| 9,431,249 B2* | 8/2016 | Pattanayak | H01L 29/0634 |
| 11,127,854 B2* | 9/2021 | Katou | H01L 29/42368 |
| 2003/0047777 A1 | 3/2003 | In't Zandt et al. | |
| 2016/0064546 A1 | 3/2016 | Zitouni et al. | |
| 2016/0254367 A1* | 9/2016 | Jin | H01L 29/4236 438/269 |
| 2021/0296454 A1* | 9/2021 | Fujino | H01L 29/7813 |
| 2021/0296474 A1* | 9/2021 | Sandow | H01L 29/4236 |

* cited by examiner

*Primary Examiner* — Douglas W Owens
(74) *Attorney, Agent, or Firm* — Brake Hughes Bellermann LLP

(57) ABSTRACT

In a general aspect, a trench-gate field-effect transistor can include an active region and a termination region. The termination region can include a structure where a portion in which formation of a PN junction is prevented (e.g., a termination extension and one or more semiconductor mesas) is overlapped with a portion of the trench-FET that includes a boundary (edge, etc.) between trenches (or portions of trenches) lined with only shield (thick oxide) and trenches lined with a stepped-shield dielectric (SSO) structure (e.g., shield dielectric and gate dielectric). That boundary can be referred to an SSO edge. Prevention of PN junction formation (e.g., during a channel and/or body implant for the trench-FET), in the disclosed approaches, can be accomplished using a polysilicon layer to block formation of, e.g., a p-type layer, in a semiconductor substrate (e.g., an n-type semiconductor region, epitaxial layer, etc.).

20 Claims, 11 Drawing Sheets

TERMINATION STRUCTURES FOR TRENCH-GATE FIELD-EFFECT TRANSISTORS

CROSS-REFERENCE TO RELATED APPLICATIONS

This application claims the benefit of U.S. Provisional Patent Application No. 62/705,646, filed on Jul. 9, 2020, the entire contents of which is incorporated herein by reference.

TECHNICAL FIELD

This description relates to power semiconductor devices. More specifically, this description relates to termination structures for trench gate field-effect transistors (trench-FETs) and related methods for producing such devices.

BACKGROUND

Power semiconductor devices, such as trench-gate field effect transistors (trench-FETs) are widely used in a number of commercial and industrial applications, such as consumer electronic devices and industrial control devices, as some examples. In such trench-FET devices, approaches taken to achieve improvements in one or more operational parameters can negatively affect one or more other operational parameters of the trench-FET. For instance, approaches taken to improve on-resistance, or specific resistance (Rsp), can result in undesired reductions in breakdown voltages of the trench-FET (e.g., drain-to-source breakdown voltage and/or gate-to-source breakdown voltage). As another example, measures taken to improve Rsp of a trench-FET (or other device operational parameters) can cause increases in leakage current, e.g., as a result of reduced integrity of a gate dielectric (gate oxide) disposed in, and on tips of trenches disposed in a termination region (junction termination region, etc.) of an associated trench-FET.

SUMMARY

In a general aspect, a trench-gate field-effect transistor (trench-FET) can include a semiconductor region of a first conductivity type and a plurality of trenches defined within the semiconductor region. The plurality of trenches can be arranged (aligned, etc.) in parallel with one another. The trench-FET can further include an active region including a portion of a first trench of the plurality of trenches, and a termination region at least partially surrounding the active region. The termination region can include a second trench of the plurality trenches, where the second trench can be disposed at an end of the plurality of trenches. The termination region can also include a termination extension of the first conductivity type disposed adjacent to the second trench. The termination extension can exclude a trench, and exclude an implant of a second conductivity type opposite the first conductivity type. The portion of the first trench can have a dielectric material of a first thickness disposed on a bottom surface, a lower portion of a first sidewall, and a lower portion of a second sidewall of the first trench, where the second sidewall is opposite the first sidewall. The portion of the first trench can also have a dielectric material of a second thickness disposed on an upper portion of the first sidewall and an upper portion of the second sidewall, the first thickness being greater than the second thickness. The second trench can have the dielectric material of the first thickness disposed on a bottom surface and a first sidewall of the second trench, the first sidewall of the second trench being adjacent to the termination extension.

Figure 1A:
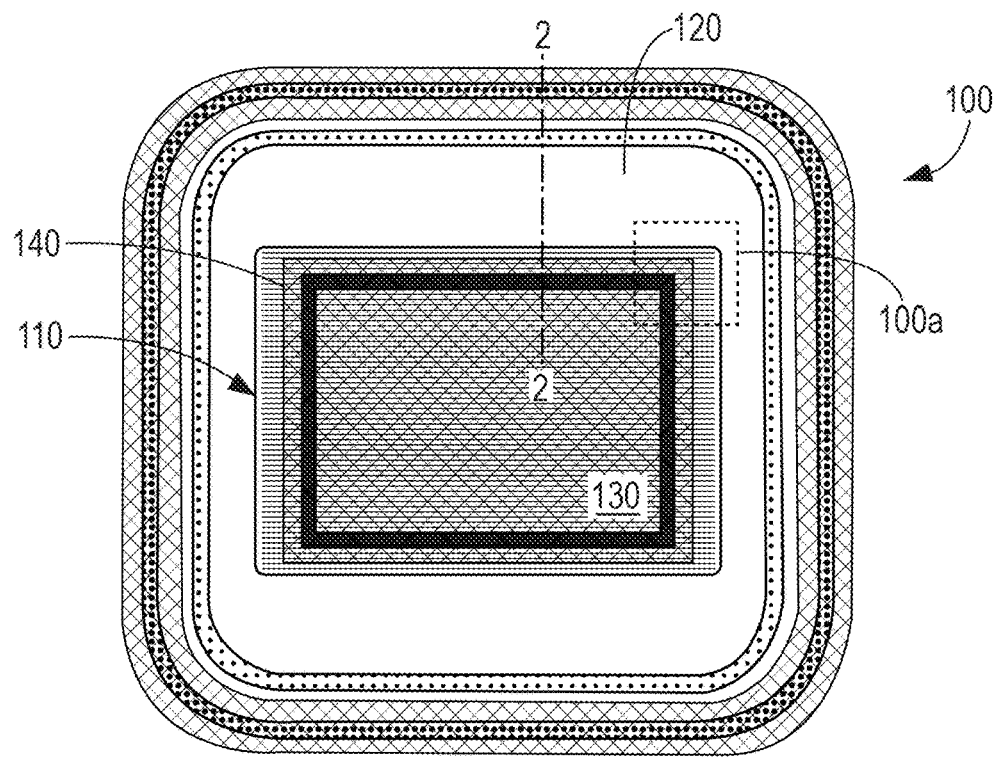
FIG. 1A is a diagram illustrating a top-down, plan view (e.g., design/mask layout view) of a trench-gate field-effect transistor (trench-FET).

In the drawings, like reference symbols in the various drawings indicate like elements. Reference numbers for some like elements may not be repeated for all such elements. In certain instances, different reference numbers may be used for like elements, or similar elements. Some reference numbers for certain elements of a given implementation may not be repeated in each drawing corresponding with that implementation. Some reference numbers for certain elements of a given implementation may be repeated in other drawings corresponding with that implementation, but may not be specially discussed with reference to each corresponding drawing.

DETAILED DESCRIPTION

Power semiconductor devices (power devices), such as trench-gate field-effect transistors (trench-FETs), can be implemented in a semiconductor die (e.g., semiconductor region, etc.). For instance, a semiconductor die can have an active region (active area, etc.) where an array (arrangement, etc.) of a plurality of semiconductor mesas and an associated plurality of trenches (e.g., parallel arranged trenches) that implement a given power device are located. For example, a plurality of trenches formed in a semiconductor region can define the corresponding semiconductor mesas between adjacent (e.g., directly adjacent) trenches. Gate electrodes, shielded gate electrodes and/or shield electrodes can be formed in the trenches, while other elements of the device (e.g., a body region, source regions, heavy body regions, etc.) can be defined in the mesas, e.g., between the trenches in the active region.

The semiconductor die can also include a termination region (field termination area, termination area, etc.) that is disposed around or adjacent to (completely surrounds, partially surrounds, borders, etc.) the active region. The termination region can be used to minimize electric fields around the active area, and can be configured not to conduct current during operation of a power semiconductor device (e.g., trench-FET) that is implemented in the active region. In some implementations, one or more trenches of the plurality of trenches (e.g., ends of the trenches) can extend from the active region into the termination region to form, at least in part, a termination structure. Also, one or more trenches of the plurality of trenches can be included (e.g., wholly included) in the termination region (e.g., where such trenches do not have a portion that is included in the active region). Such trenches that are included (wholly included) in the termination region can be located at, or near ends of the plurality of parallel arranged trenches included in a given trench-FET device, such as in the approaches described herein.

As noted above, features of a given device (e.g., a trench-FET) that are implemented to improve one or more performance parameters of the device (e.g., such as Rsp) can also result in (cause, lead to, contribute to, etc.) degradation of other parameters, such as breakdown voltages and/or leakage currents. For instance, implementing a shield (thick) dielectric (oxide, etc.) in lower portions of trenches (e.g., gate trenches, terminations trenches, etc.), in combination with a gate (thin) dielectric (oxide, etc.) in upper portions of the trenches (e.g., using a stepped shield oxide (SSO) structure, such as described herein) can provide a shield plate effect (e.g., with the shield dielectric), and allow for increasing doping concentration of a drain region (e.g., in an associated semiconductor region or substrate) to reduce Rsp.

However, such increases in drain doping concentration can also reduce drain-to-source breakdown voltage (Bvds) in a termination region (e.g., in a termination extension excluding any trenches providing such a shield plate effect). For instance, such a breakdown can occur due, in part, to breakdown (e.g., avalanche breakdown due to impact ionization) of a PN-junction defined by a channel implant (e.g., a p-type implant, p-type layer, etc.) and the drain region (e.g., with higher doping concentration) in a termination extension portion of the termination region. Such a termination extension, as described herein, can be a portion of the termination region that does not include (e.g., excludes) trenches of an associated trench-FET and, therefore, does not have a field plate effect resulting from an associated thick dielectric in the trenches (e.g., in an SSO structure).

Further, use of SSO in trenches (or portions of trenches) that are disposed in the termination region can lower a gate-to-source breakdown voltage (Bvgs) and/or increase leakage current of an associated trench-FET due to lower gate dielectric integrity in the termination region, which can also be referred to as gate oxide integrity (GOI). For purposes of this disclosure, gate dielectric integrity or gate oxide integrity will be collectively referred to as GOI. Still further, use of SSO in trenches (or portions of trenches) in a trench-FET termination region can result in electrostatic potential (e-potential) bending in an associated termination extension. This e-potential bending can occur due to the thickness difference/change (e.g., in an SSO structure) between the shield dielectric and the gate dielectric (e.g., change in capacitance) of trenches (or portions of trenches) in the termination region that are adjacent to (e.g., directly adjacent to, in contact with, directly in contact with, and so forth) the termination extension. Such e-potential bending can also lower Bvds and/or cause increase leakage of an associated FET.

Implementations of trench-FETs (and associated methods of manufacture) described herein can address and/or prevent at least some of the foregoing issues (e.g., prevent breakdown voltage reductions, and/or leakage current increases). For instance, the implementations described herein are implemented by overlapping a portion of the termination region of a trench-FET in which formation of a PN junction is prevented with a portion of the trench-FET that includes a boundary (edge, etc.) between trenches (or portions of trenches) lined with only shield (thick oxide) and trenches lined with a SSO structure (e.g., shield dielectric and gate dielectric). For purposes of this disclosure, that boundary will be referred to an SSO edge. Prevention of PN junction formation (e.g., during a channel and/or body implant for the trench-FET), in the disclosed approaches, can be accomplished using a polysilicon layer to block formation of, e.g., a p-type layer, in a semiconductor substrate, e.g., an n-type semiconductor region, epitaxial layer, etc.).

An SSO edge can be defined using photolithography techniques. In some implementations, photomasking can be used to define where shield dielectric is, and is not to be removed prior to forming gate (thin) dielectric for the associated trench-FET (e.g., in an active region of the FET). In such implementations, trenches and/or portions of trenches (and associated semiconductor region mesas) that are disposed adjacent to the termination extension can include (being lined with, have disposed thereon, etc.) shield dielectric (e.g., where shield dielectric is not etched outside the defined SSO edge). This can improve overall GOI of the associated trench-FET, as well as prevent e-potential bending in the termination extension.

FIG. 1A is a diagram illustrating a top-down, plan (e.g., layout) view of an embodiment of a trench-gate field-effect transistor (a trench-FET 100). The trench-FET 100 includes trenches 110 (e.g., a plurality of parallel arranged trenches, parallel aligned, aligned in parallel, arranged in parallel, parallel to one another, etc.). The trench-FET 100 also includes a polysilicon layer 120 that can implement a gate feed for the trench-FET 100 (e.g., can be electrically couple with polysilicon gate electrodes disposed in the trenches). The polysilicon layer 120 can be disposed over a termination extension (not shown in FIG. 1A) of the trench-FET 100 as well as trenches (and/or portions of trenches) located in a termination region of the trench-FET 100. As shown in FIG. 1A, the trench-FET 100 also includes a contact region 130, where the contact region 130 can be implemented using a metal (e.g., source metal) layer that provides an electrical connection to source regions and body regions of the trench-FET 100, where those source and body regions can be implemented in mesas of a semiconductor region defined by the trenches 110.

Figure 1B:
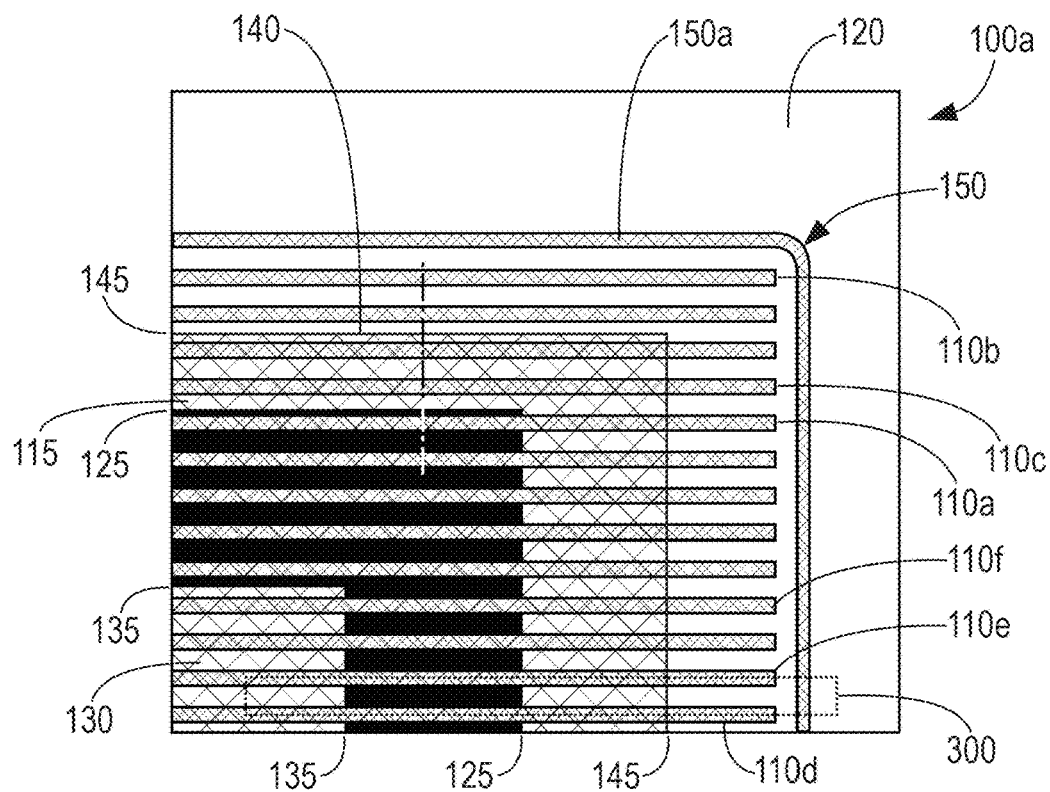
FIG. 1B is a diagram illustrating a magnified view of a portion of the trench-FET of FIG. 1A.
Figure 2:
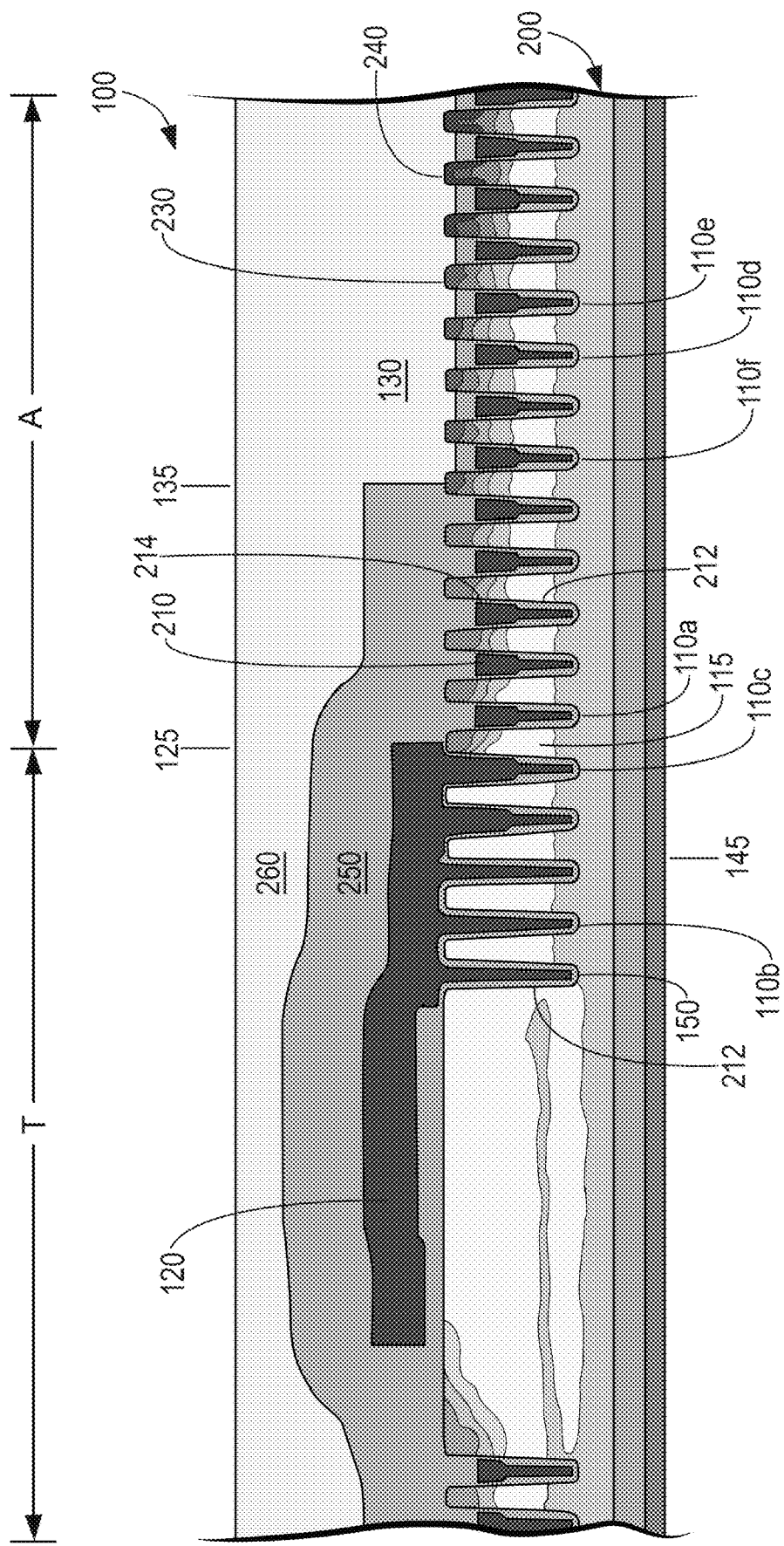
FIG. 2 is a diagram illustrating a cross-sectional view of the trench-FET of FIGS. 1A and 1B.

Also shown in FIG. 1A is a section-line 2-2, which corresponds with a cross-section of the trench-FET 100 shown in FIG. 2. Further, FIG. 1A includes an dashed-line inlay that indicates a portion 100*a* of the trench-FET 100. A zoomed in (magnified) view of the portion 100*a* is illustrated in FIG. 1B, which shows the arrangement (e.g., overlap) of the polysilicon layer 120 and an SSO edge, such as described further below.

As noted above, FIG. 1B is a diagram illustrating a magnified view of the portion 100*a* of the trench-FET 100 of FIG. 1A. The portion 100*a* is a corner of the trench-FET 100 and includes illustrative portions of an active region and a termination region of the trench-FET 100. In the embodiments described herein, reference is made to active and termination regions. It is noted, however, that the exact boundary between an active region and a termination region will depend on the particular implementation. For instance, in some implementations, a trench-FET 100 can be referred to as also including a transition region, which can be implemented as a transition between an active region and a termination region. For instance, in the portion 100*a*, the trench-FET 100 could be described as including a transition region between the contact region 130 and an edge of the polysilicon layer 120. While, in some implementations, a transition region may be considered to be separate from the active region and the termination region, the transition could also be considered, at least in part, to be part of the active region or part of the termination. Accordingly, in this disclosure, a transition region (or portions of a transition region) may be referred to as being part of an active region of a trench-FET and/or may be referred to as being part of a termination region of the trench-FET.

The portion 100a of the trench-FET 100 shown in FIG. 1B includes a trench 110a, a trench 110b, a trench 110c, a trench 110d, a trench 110e and a trench 110f of the trenches 110. The portion 100a also illustrates the polysilicon layer 120 and the contact region 130. FIG. 1B further illustrates an SSO mask 140, which defines an SSO edge 145 for the trench-FET 100. In this implementation, within the SSO mask 140 (e.g., inside the SSO edge 145), shield dielectric can be etched (removed in selected areas) prior to forming a gate dielectric (e.g., in upper portions of portions of the trenches 110, as defined by the SSO mask 140 and within the SSO edge 145). Likewise in this example, outside of the SSO mask 140 (e.g., outside the SSO edge 145), shield dielectric is not etched and the trenches, portions of trenches, and associated semiconductor mesas (e.g., trench tops, trench tips, etc.) can have shield (thick) dielectric disposed therein, or thereon.

For purposes of the discussion of the trench-FET 100, portions of the trench-FET 100 that could be referred to as being included in a transition region may be referred to as being included in an active region of the trench-FET 100. That is, the trench-FET 100 may be described as including an active region and a termination region (e.g., without reference to a transition region). In other words, for purposes of the discussion of the trench-FET 100 and the portion 100a, an edge 125 of the polysilicon layer 120 can define a boundary between an active region and a termination region of the trench-FET 100. In some implementations, a different boundary can be used, or three independent (active, transition and termination) regions could be described and/or referenced. In some implementations, an boundary between an active region and a termination region (or a transition region) of the trench-FET 100 can be defined by an edge 135 of the contact region 130. In some implementations, the boundary between an active region and a termination region can be defined between the edge 125 and the edge 135.

In this example implementation, as is shown in FIG. 1B, the edge 125 of the polysilicon layer 120 can be located on a mesa 115 of a semiconductor region in which the trench-FET 100 is implemented. In some implementations, the mesa 115 (as well as other semiconductor mesas of the trench-FET 100) can have a width (e.g., between adjacent trenches) of approximately 240 nm. Accordingly, placement of the edge 125 can be (should be) accomplished using precise photolithography operations. In this implementation, while a specific placement position of the SSO edge 145 is shown, it will be appreciated that SSO edge 145 can be placed (selectively place) between an outer trench (e.g., a perimeter trench 150 in this example) and the edge 125 of the polysilicon layer 120. Accordingly, placement of the SSO edge 145 can be done with less precise photolithography operations than placement of the edge 125.

The trenches 110a-110f (of the trenches 110) are further described below with respect to FIGS. 2, 3A and 3B. As shown in FIG. 1B, the trench-FET 100 also includes the perimeter trench 150 that can surround (at least partially surround) the trenches 110 (e.g., the parallel arranged trenches). In some implementations, a portion 150a of the perimeter trench 150 can be considered to be included in (part of) the trenches 110 (e.g., one of the parallel arranged trenches 110). In some implementations, the perimeter trench 150 could be omitted, resulting in, for the trench-FET 100, the trench 110b being an outermost, last, exterior, trench, or end trench of the plurality of parallel trenches 110. In the implementation of FIG. 1B, the portion 150a of the perimeter trench 150 can be referred to as being an end (outermost) trench of the parallel arranged trenches 110. Such an end trench can be referred to as being adjacent to (directly adjacent to, in contact with, etc.) a termination extension disposed under the polysilicon layer 120. As discussed herein, the end trench (in additional to other trenches of the trenches 110) can have shield dielectric disposed therein (e.g., are located outside the SSO edge 145 of the SSO mask 140).

Figure 3A:
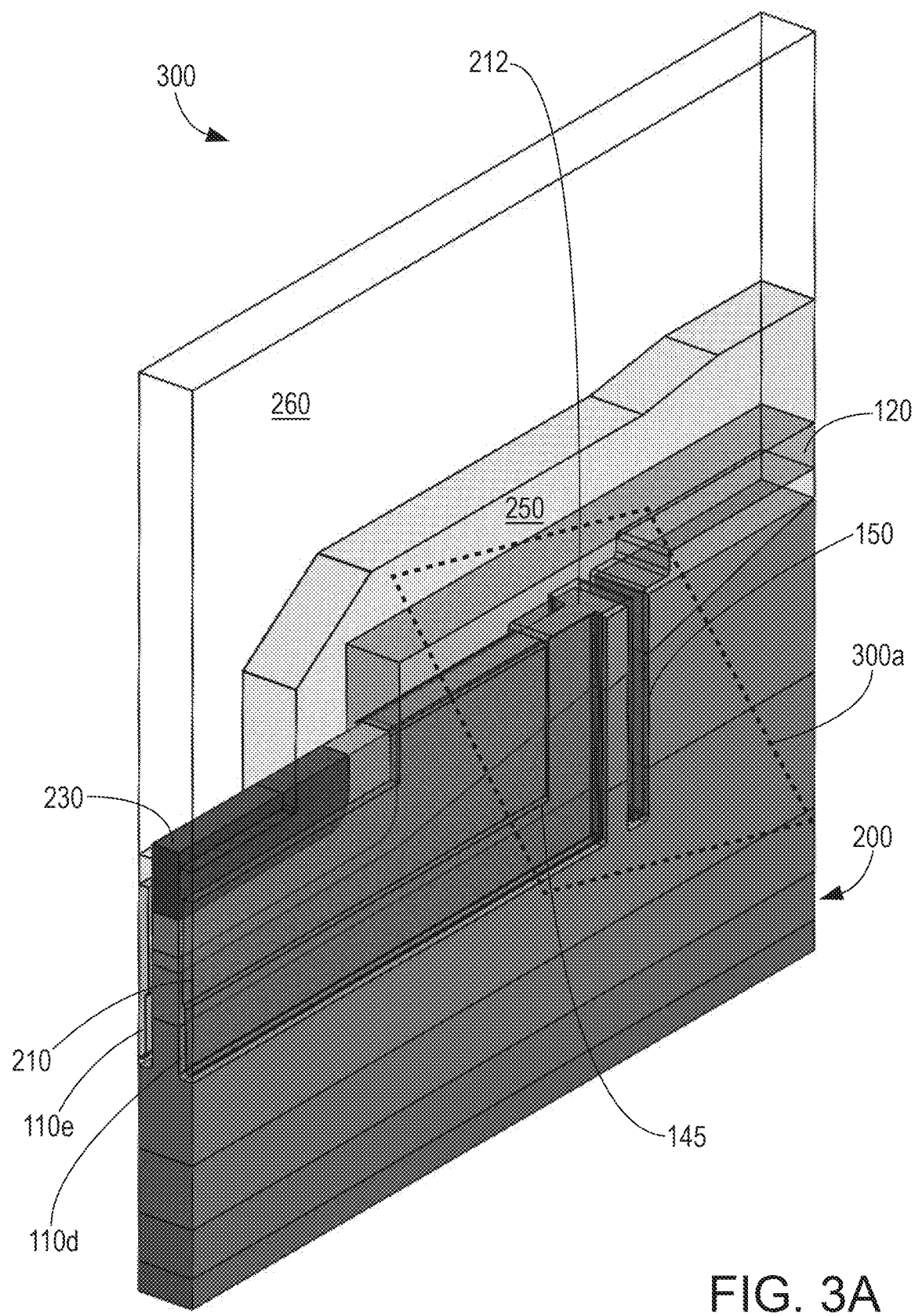
FIG. 3A is a diagram illustrating an isometric view of a cross-sectional slice of the trench-FET of FIGS. 1A and 1B.
Figure 3B:
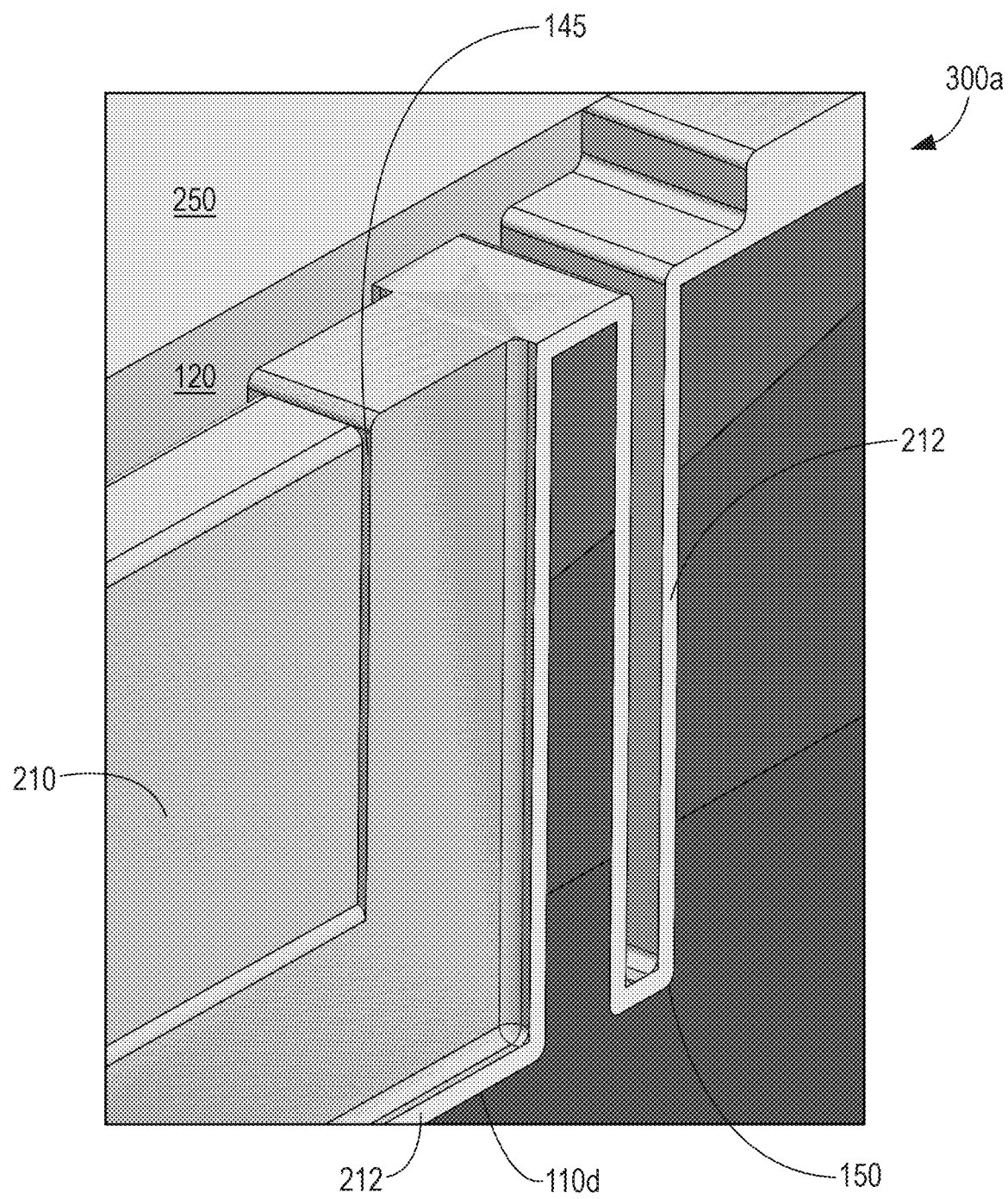
FIG. 3B is a diagram illustrating a magnified view of a portion of the cross-sectional slice of the trench-FET shown in FIG. 3A.

FIG. 1B further includes a dashed-line inlay that indicates a cross-sectional slice 300 of the trench-FET 100 that is further illustrated in FIGS. 3A and 3B. A zoomed in (magnified) view of the cross-sectional slice 300 is illustrated in FIGS. 3A and 3B, which show the arrangement (e.g., overlap) of the polysilicon layer 120 and an SSO edge (e.g., an SSO edge 145), such as described further below. It is noted that, as compared to, at least, FIG. 2 and the process flow of FIGS. 5A-5I, source metal is not shown in FIG. 1B.

FIG. 2 is a diagram illustrating a cross-sectional view of the trench-FET 100 of FIGS. 1A and 1B. Referring to FIG. 2, an example arrangement of elements of the trench-FET 100 along section-line 2-2 shown in FIG. 1B is shown. Specifically, FIG. 2 illustrates an example arrangement of the trenches 110a-110f, the polysilicon layer 120, the edge 125 of the polysilicon layer 120, the contact area 130, the SSO edge 145 and the perimeter trench 150. FIG. 2 also illustrate gate electrodes 210 disposed in the trenches, and a termination extension 220. FIG. 2 further illustrates a channel implant 230 and a source implant 240 formed in semiconductor mesas of a semiconductor region 200 (e.g., an n-type semiconductor region). One or more of the mesas can also include a body implant, which is not specifically referenced in FIG. 2, but is discussed with respect to a semiconductor process illustrated in FIGS. 5A-5I.

In the trench-FET 100 the gate electrodes 210 can be electrically coupled with the polysilicon layer 120. As shown in FIG. 2, the SSO edge 145 is located under the polysilicon layer 120, and channel, source and body implants are excluded (not present) under the polysilicon layer 120, which is also disposed over the termination extension 220. The trench-FET 100, as shown in FIG. 2, further includes an interlayer dielectric layer (an ILD layer 250) and a source metal layer 260, wherein the ILD layer 250 electrically isolates the polysilicon layer 120 and the gate electrodes 210 from the contact region 130's metallization and the source metal layer 260.

Referring to FIG. 2 (in conjunction with FIGS. 1A and 1B), the trench-FET 100 includes a semiconductor region 200 of a first conductivity type (e.g., n-type). The trench-FET 100 also includes a plurality of trenches, including the trenches 100a-100f, that are defined within the semiconductor region 100. As shown in FIG. 2 (as well as FIGS. 1A and 1B) the plurality of trenches are arranged in parallel with one another. The trench-FET 100 includes an active region A that includes at least a portion of a first trench 110a of the plurality of trenches (and could be referred to as also including a transition region, as discussed herein). The trench-FET 100 also includes a termination region T that at least partially surrounds the active region A. As shown in FIG. 2, the termination region T can include a second trench 110b (if the perimeter trench is omitted) or a portion 150a of the perimeter trench 150. The second trench 110b or the portion 150a of the perimeter trench 150 can be disposed at an end of the plurality of trenches, as shown in FIG. 2.

The termination region T can also include a termination extension 220, where the termination extension 220 is of the first conductivity type, and is disposed adjacent to the second trench 110b or the portion 150a of the perimeter trench 150. The termination extension 220, in this example, excludes a trench, and excludes an implant (e.g., channel implant) of a second conductivity type opposite the first conductivity type (e.g., p-type). As shown, the portion of the first trench 110a (in the active region) can having a shield dielectric material 212 of a first thickness disposed on a bottom surface, a lower portion of a first sidewall, and a lower portion of a second sidewall of the first trench. The second sidewall can be opposite the first sidewall. The portion of the first trench 110a (in the active region) can include a dielectric material (a gate dielectric material 214) of a second thickness disposed on an upper portion of the first sidewall and an upper portion of the second sidewall. In the trench-FET 100, the first thickness (e.g., of the shield dielectric 212) is greater than the second thickness (e.g., of the gate dielectric material 214). In the trench-FET 100, the second trench (e.g., the trench 110b or the portion 150a of the perimeter trench 150) can have the shield dielectric material 212 disposed on a bottom surface and a first sidewall, the first sidewall of the second trench being adjacent to the termination extension 220 (and can be in direct contact with the termination extension 220.

As shown in FIG. 2, the polysilicon layer 120 can be disposed on the termination extension 220 and over the second trench (the trench 110b or the portion 150a of the perimeter trench 150). An edge 125 of the polysilicon layer 120 can disposed on a semiconductor mesa 115 defined between two adjacent trenches 110a and 110c of the plurality of trenches. That is, in some implementations, such as this example, the edge 125 of the polysilicon layer 120 can be disposed on a mesa of the semiconductor region 200 that is disposed between the second trench (the trench 110b of the portion 150a of the perimeter trench 150) and a third trench of the plurality of trenches. The third trench can be disposed adjacent to the second trench, and disposed between the first trench and the second trench. In some implementations, the edge 125 of the polysilicon layer 120 can be disposed on a mesa of the semiconductor region 200 that is disposed between the first trench (e.g., the 110a) and a third (e.g., the trench 110c) of the plurality of trenches. That is the third trench can be disposed adjacent to the first trench, and disposed between the first trench and the second trench, where the polysilicon layer 120 is further disposed over the third trench (e.g., the trench 110c).

As shown in FIG. 2, the second trench (e.g., the trench 110b and/or the portion 150a of the perimeter trench 150) can further have the shield dielectric 212 disposed on a second sidewall, the second sidewall of the second trench being opposite the first sidewall of the second trench. In some implementations, the second trench (e.g., the trench 110b and/or the portion 150a of the perimeter trench 150) can have the shield dielectric material 212 disposed on a lower portion of its second sidewall, and the gate dielectric material 214 disposed on an upper portion of its second sidewall. As shown in FIGS. 1A-2, the active region A can include respective portions of a plurality of trenches, not just a portion of the trench 110. For instance, the trenches 110d, 110e and 110f have portions included in the active region A. The trenches with portions included in the active region can be adjacent to one another (and arranged in parallel). The active portions of the trenches, as shown in FIG. 2, can have a dielectric arrangement (shield and gate dielectrics) consistent with that of the first trench (the trench 110a).

As shown in FIGS. 1A, 1B and 2, in this example, the perimeter trench 150 (if not omitted) can be disposed (at least partially) around the plurality of trenches 110. The perimeter trench 150 can have the shield dielectric 212 disposed therein, as is shown in FIG. 2, and a portion of the perimeter trench can be disposed between the second trench (the trench 110b) and the termination extension 220.

Referring still to FIG. 2 (in conjunction with FIGS. 1A and 1B, trenches of the parallel arranged trenches that have respective portions in the active region can be arranged, with reference to, e.g., the trench 110e such that they have a first portion in the active region (e.g, inside the SSO edge 145) a second portion on a right end of FIG. 1B (and FIG. 1A) that is in the termination region (e.g., outside the SSO edge 145), and a third portion on a left end of FIG. 1A (and FIG. 1A) that is in the termination region (e.g., outside the SSO edge 145). The first portion of the trench (e.g., the trench 110e) can be disposed between its second portion and its third portion. In this example, the termination extension 220 can include a first portion adjacent to the second portion of the first trench (e.g., on a right side of FIG. 1A), and a second portion adjacent to the third portion of the first trench (e.g., on a left side of FIG. 1A). The trench (e.g., the trench 110e), in this example, is disposed between the first portion of the termination region 220 and the second portion of the termination region 220. Further in this example, an end trench of the plurality of parallel arranged trenches (e.g., the trench 110b or the portion 150a of the perimeter trench 150) can be adjacent to (e.g., directly adjacent to) a third portion of the termination region 220 (at a top of FIG. 1A and/or FIG. 1B). The trenches in this example can include dielectrics and polysilicon electrodes, such as in the arrangements described herein.

FIG. 3A is a diagram illustrating an isometric view of a cross-sectional slice 300 of the trench-FET of FIGS. 1A and 1B. As noted above, the cross-sectional slice 300 is designated in FIG. 1B by a dashed inlay, and is sectioned through trenches 110d a and 110e of FIGS. 1B and 2. As with FIG. 2, FIGS. 3A and 3B shown an example arrangement of various elements of the trench-FET 100 shown in FIGS. 1A and 1B. For instance, FIG. 3A illustrates an example arrangement of the trenches 110d and 110e, the polysilicon layer 120, the SSO edge 145, the perimeter trench 150, the semiconductor region 200, the gate electrodes 210 (in trenches 110d and 110e), the channel implant 230, the ILD layer 250 and the source metal layer 260.

As can be seen in FIG. 3A (and FIG. 3B), the SSO edge 145 is consistent with a change in dielectric thicknesses in the trenches 110d and 110e, e.g., between the gate dielectric disposed on the upper portions of the trenches inside the SSO edge 145 and the shield dielectric material 212 disposed on the upper portions of the trenches outside the SSO edge 145. As can also be seen in FIG. 3A, a surface of the semiconductor region 200 between the perimeter trench 150 and the parallel trenches 110 (e.g., the trenches 110d and 110e), which can be referred to as a trench top or trench tip, has the shield dielectric material 212 disposed thereon. As discussed herein, such an arrangement can improve GOI of the associate trench-FET 100 and, as a result, improve Vgs for the trench-FET 100. FIG. 3B illustrates a zoomed in portion 300a of the cross-sectional slice 300 shown in FIG. 3A and is not discussed in further detail here.

Figure 4:
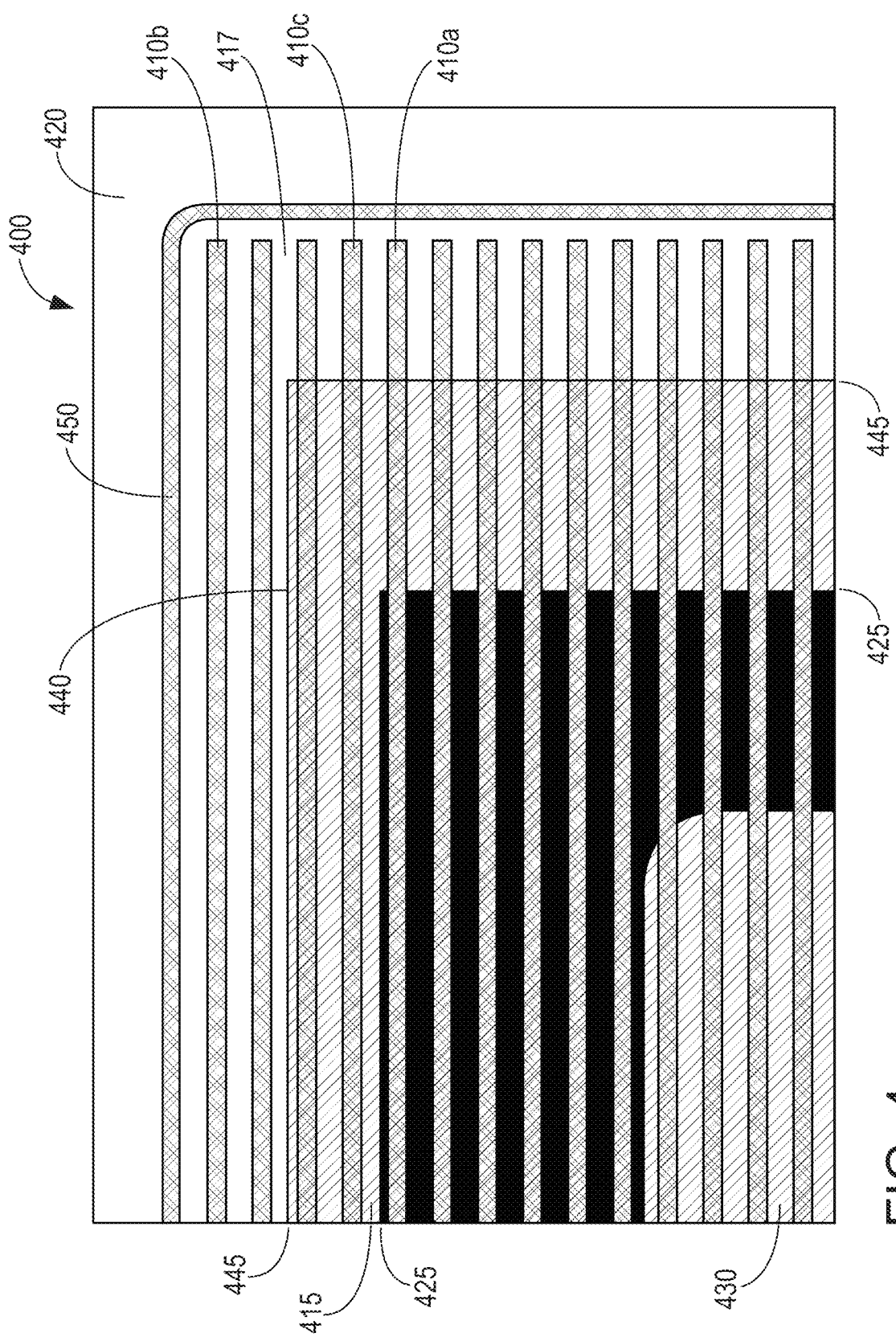
FIG. 4 is a diagram illustrating a top-down, plan view (e.g., design/mask layout view) of a portion of another trench-FET.

FIG. 4 is a diagram illustrating a top-down, plan (e.g., layout) view of a portion of another embodiment of a trench-gate field-effect transistor (a trench-FET 400) that is a further zoomed in view of the portion 100a of the trench-FET 100 shown in FIG. 1B and of the cross-section of FIG. 2. For instance, the portion of the trench-FET 400 shown in FIG. 4 includes a trench 410a, a trench 410b, and a trench 410c, which can correspond, respectively, with the trenches 110a, 110b and 110c of the trench-FET 100 of FIGS. 1A-3B. As shown in FIG. 4, the trench-FET 400 also includes a polysilicon layer 420 and a contact region 430. FIG. 4 further illustrates an SSO mask 440, which defines an SSO edge 445 for the trench-FET 400. In this implementation, as with the trench-FET 100, within the SSO mask 440 (e.g., inside the SSO edge 445), shield dielectric can be etched (removed in selected areas) prior to forming a gate dielectric (e.g., in upper portions of portions of the trenches). Likewise in this example, outside of the SSO mask 440 (e.g., outside the SSO edge 445), shield dielectric is not etched and the trenches, portions of trenches, and associated semiconductor mesas (e.g., trench tops, trench tips, etc.) can have shield (thick) dielectric disposed therein, or thereon.

In this example implementation, as is shown in FIG. 4, an edge 425 of the polysilicon layer 420 can be located on a mesa 415 (e.g., a fifth mesa counting from the top of FIG. 4) of a semiconductor region in which the trench-FET 400 is implemented. In some implementations, the mesa 415 (as well as other semiconductor mesas of the trench-FET 400), as with the trench-FET 100, can have a width (e.g., between adjacent trenches) of approximately 240 nm. Accordingly, placement of the edge 425 can be (should be) accomplished using precise photolithography operations. In this implementation, also as with the trench-FET 100, while a specific placement position of the SSO edge 445 is shown (e.g., on a third mesa counting from the top of the trench-FET 400 as shown in FIG. 4), it will be appreciated that SSO edge 445 can be placed (selectively place) between an outer trench (e.g., a perimeter trench 450 in this example) and the edge 425 of the polysilicon layer 420. Accordingly, placement of the SSO edge 445 can be done with less precise photolithography operations than placement of the edge 425.

The trench-FET 400 shown in FIG. 4 also shows that the perimeter trench 450 can surround (at least partially surround) a plurality of parallel arranged trenches, including the trenches 410a, 410b and 410c (respectively corresponding the trenches 110a-110c of FIGS. 1A-2). In some implementations, a portion of the perimeter trench 450 (such as the portion 150a of the perimeter trench 150) can be considered to be included in (part of) the trenches the parallel arranged trenches of the trench-FET 400. In some implementations, the perimeter trench 450 could be omitted, resulting in, for the trench-FET 400, the trench 410b being an outermost, or end trench of the parallel arranged trenches in FIG. 6. In this example, the portion of the perimeter trench 450 disposed in parallel to the trench 410b can be referred to as being an end (outermost) trench of the parallel arranged trenches of the trench-FET 400. Such an end trench can be referred to as being adjacent to (directly adjacent to, in contact with, etc.) a termination extension disposed under the polysilicon layer 420. As discussed herein, the end trench (in addition to other trenches of the trench-FET 400) can have shield dielectric disposed therein (e.g., trenches, or portions of trenches that are located outside the SSO edge 445 of the SSO mask 440).

FIGS. 5A-5I are cross-sectional diagrams schematically illustrating a semiconductor manufacturing process for producing trench-FETs, such as the trench-FETs shown in FIGS. 1A to 4. For purposes of illustration, the process of FIGS. 5A-5I is shown as producing the trench-FET 100. Of course, the process of FIGS. 5A-5I can be used to produce semiconductor devices (e.g., trench-FETs) having other configurations. The operations of the process of FIG. 5A-5I are briefly described and the illustrations are provided by way of reference. For purposes of brevity and clarity the details of each processing operation are not necessarily shown in FIGS. 5A-5I. For instance, process modules can be included in the process of FIGS. 5A-5I that produce other types of devices, in addition to the trench-FETs described herein. Accordingly, such devices may not be specifically illustrated. Further, process operations of multiple processing steps or processing modules may be illustrated by a single view. Accordingly, the details, and or specifics of each processing operation may not be shown. In some implementations, some operations described herein can eliminated, and/or other operations can be added to those described herein.

Figure 5A:
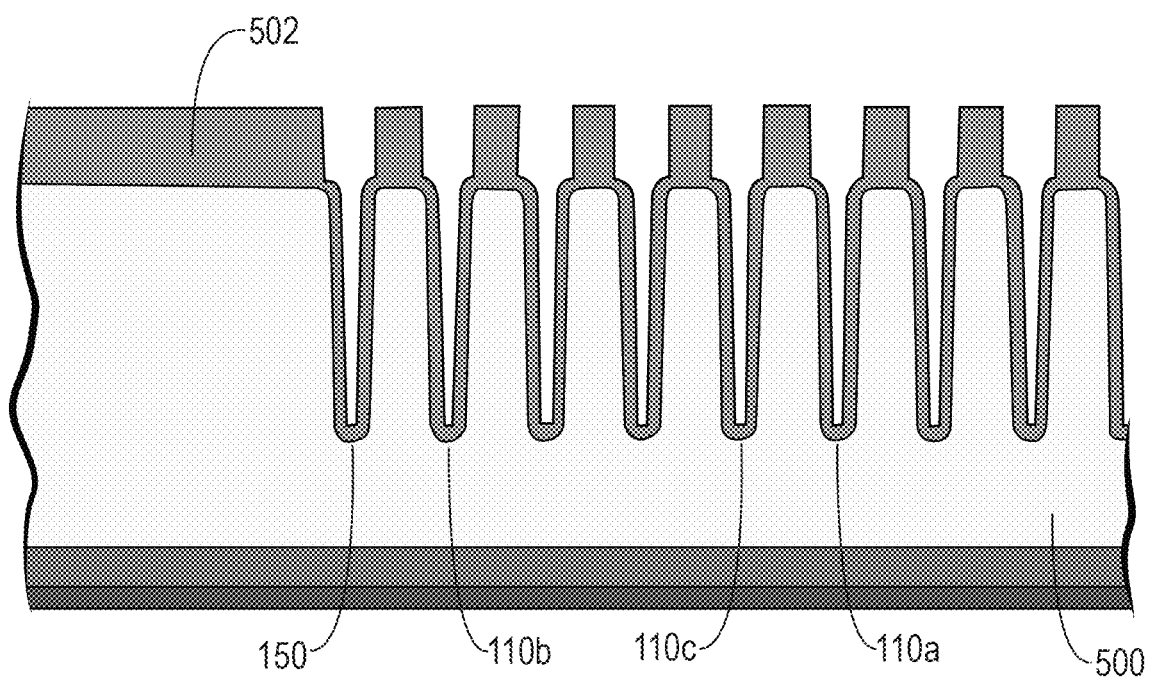
FIGS. 5A-5I are cross-sectional diagrams illustrating a semiconductor manufacturing process for producing trench-FETs, such as the trench-FETs shown in FIGS. 1A to 4.
Figure 5B:
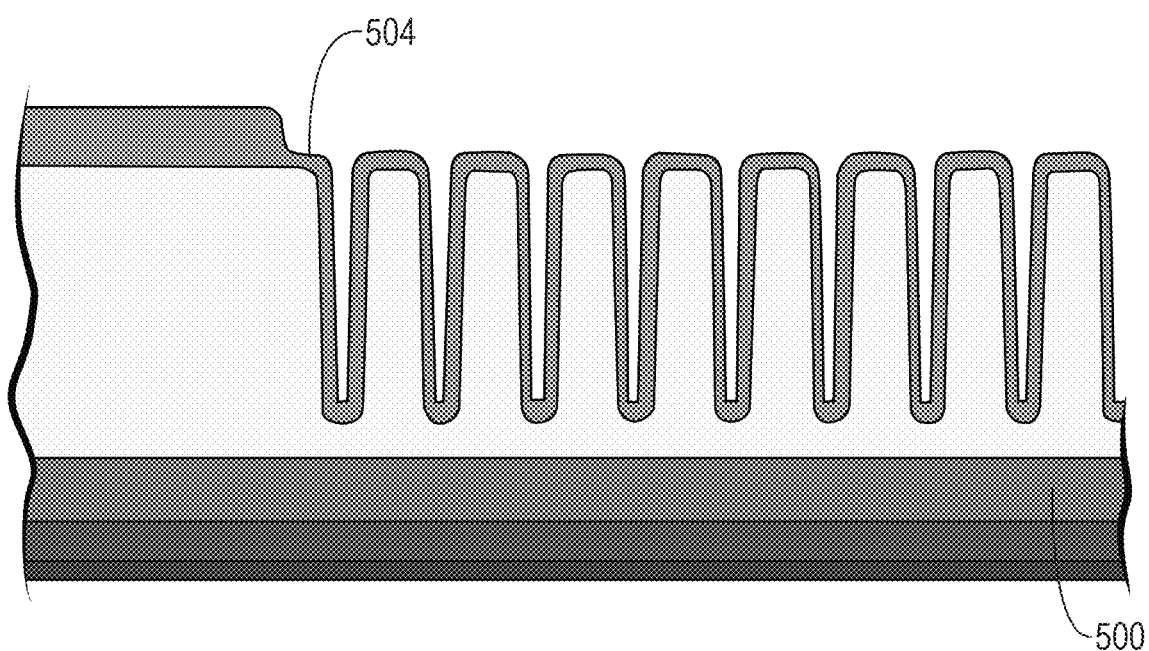

Referring to FIG. 5A, the trenches 110a-110c and 150 (as well as other trenches) can be formed in a semiconductor region 500 (e.g., an n-type semiconductor region). After forming the trenches, a sacrificial oxide (a sac-ox 502) can be formed, which can help repair damage to the semiconductor region 500 caused during formation of the trenches. Moving to FIG. 5B, the sacrificial oxide 502 can be removed (e.g., etched) and a shield dielectric layer 504 can be formed. Forming the shield oxide layer can include performing a thermal oxidation operation in combination with an oxide (e.g., a tetraethyl orthosilicate (TEOS) deposition). An anneal operation can then be formed to planarize and/or densify the shield dielectric layer 504.

Figure 5C:
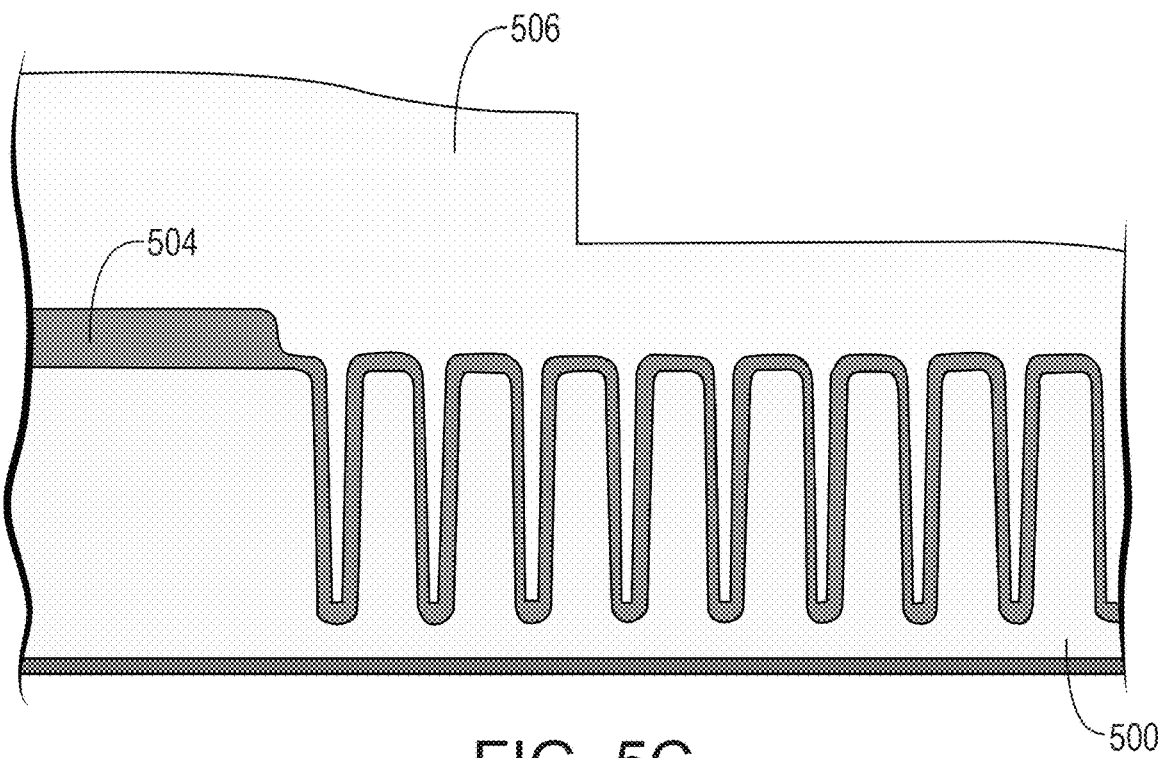
Figure 5D:
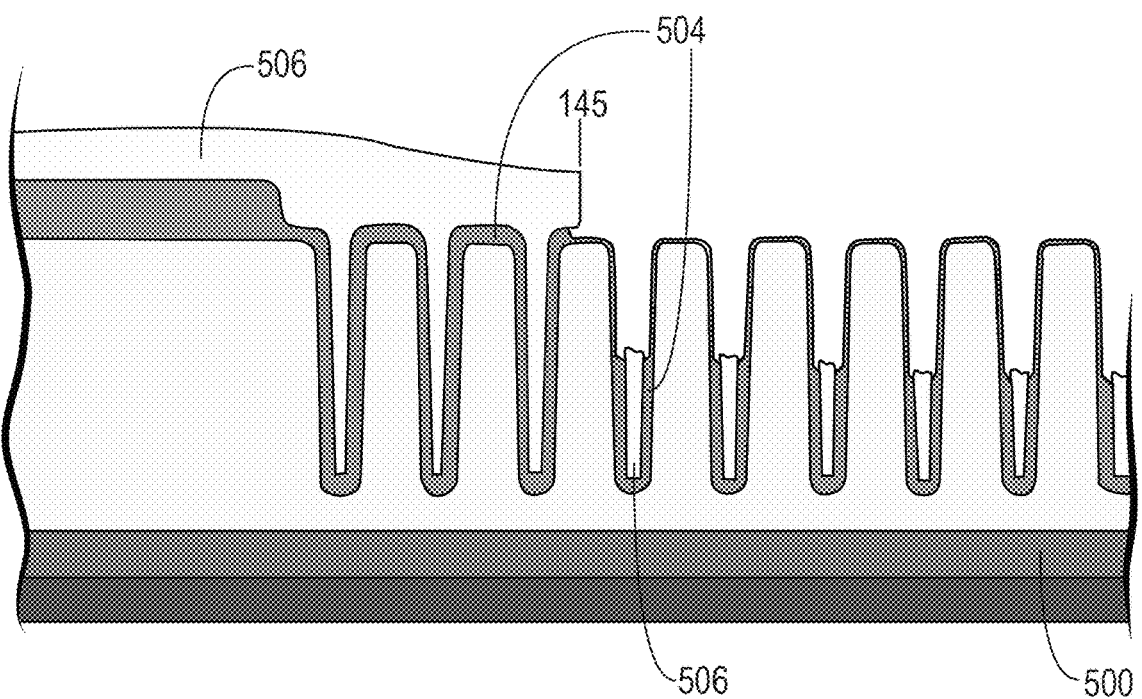
Figure 5E:
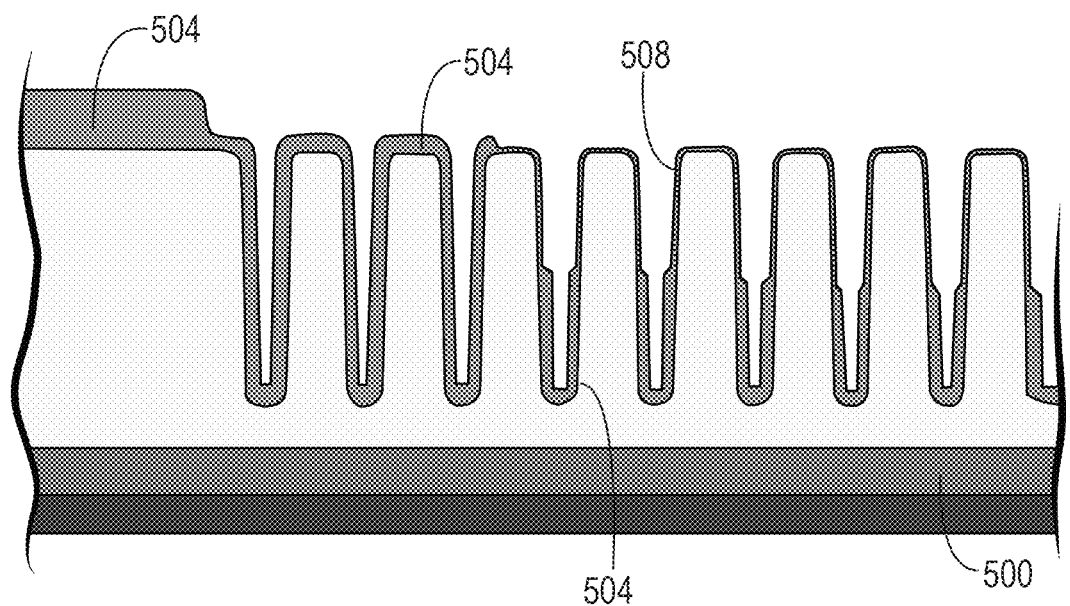
Figure 5F:
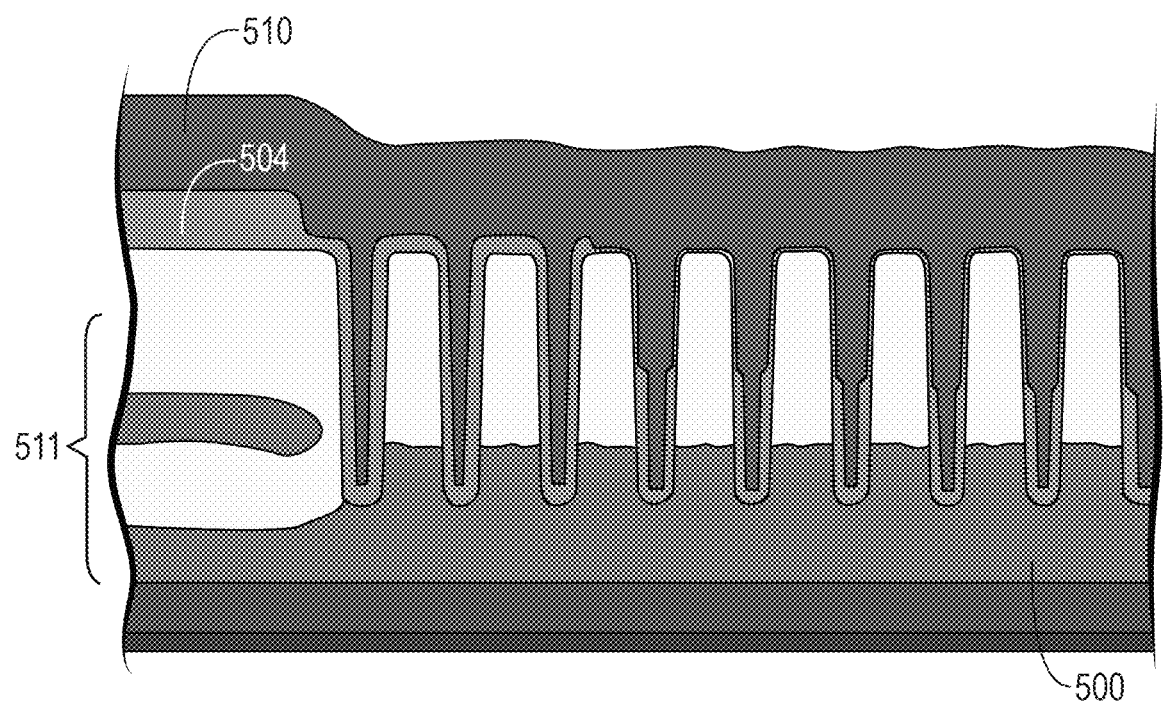

Referring to FIG. 5C, a two-stage photolithography process (e.g., with two resist coat and develop operations) can be performed to produce the stepped resist mask 506 shown in FIG. 5C. Referring now to FIG. 5D, a resist etch and an oxide (dielectric) etch can be performed to remove resist and oxide from upper portions of the active region (and transition region) trenches, such as to define the portions of those trenches where gate dielectric 508 (e.g., thermally grown $SiO_2$) will be formed, as well as define the SSO edge 145, as shown in FIG. 5E. Referring now to FIG. 5F, a polysilicon layer 510 can be formed. Also, with reference to FIG. 5F, a drain implant 511, (e.g., a high energy n-type implant) can be performed to increase drain doping concentration (and reduce Rsp of the trench-FET 100). While the details are not shown in FIG. 5F, a Zener diode process module can also be performed at this stage of the process of FIGS. 5A-5I.

Figure 5G:
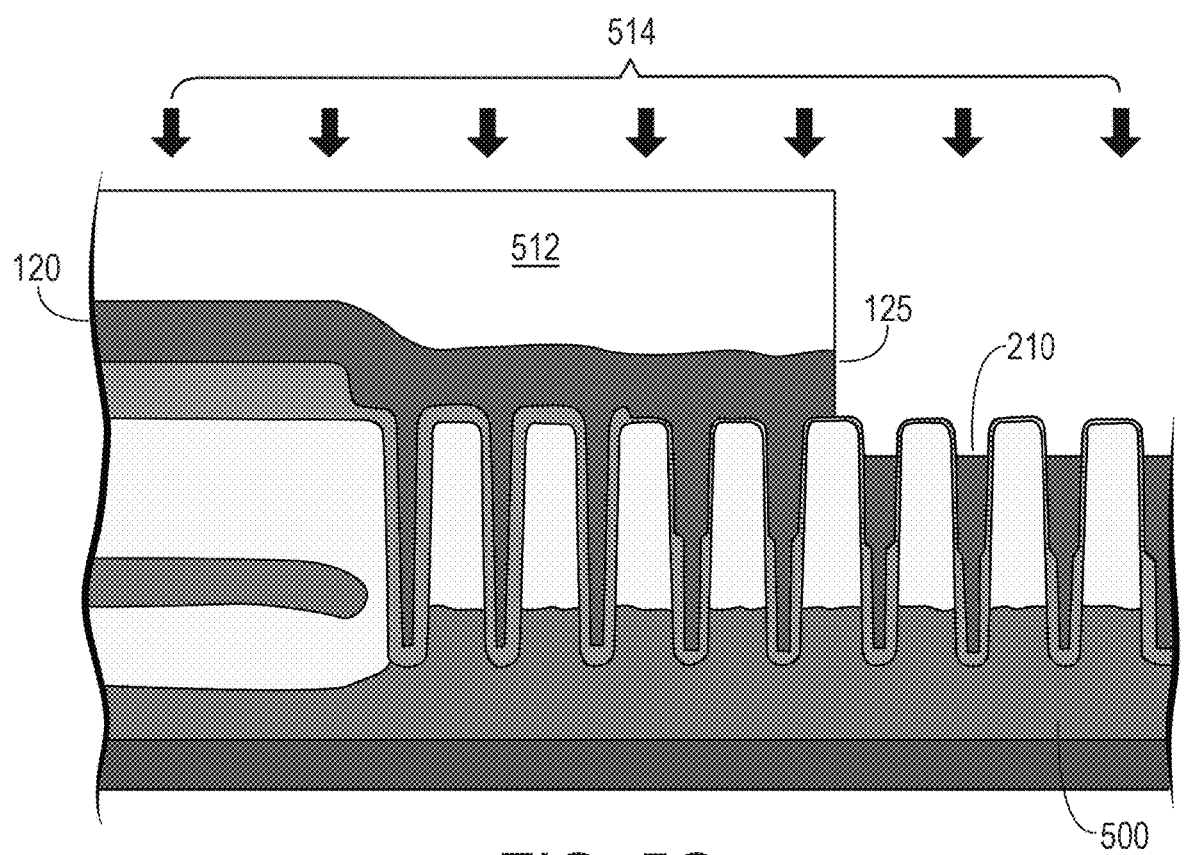
Figure 5H:
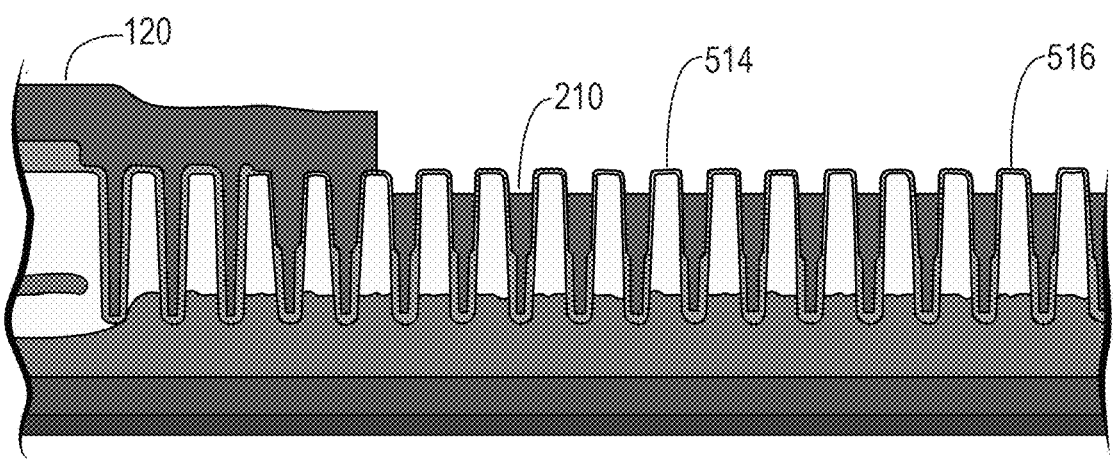

Referring now to FIG. 5G, photolithography and etch operations can be performed to form a resist mask 512, where the resist mask 512 is used, when etching the polysilicon layer 510, to define the polysilicon layer 120 and the gate electrodes 210 in the trenches of the trench-FET 100. Also with reference to FIG. 5G, a channel implant 514 (e.g., a p-type implant in this example) can be performed. In some implementations, (e.g., implementations excluding Zener diode formation) the resist mask 512 can be removed (etched) prior to performing the channel implant 514 (which may counter dope the polysilicon layer 120 and the gate electrodes 210). Referring to FIG. 5H, photolithography and implant operations can be performed to form source regions 516 of the FET 100.

Figure 5I:
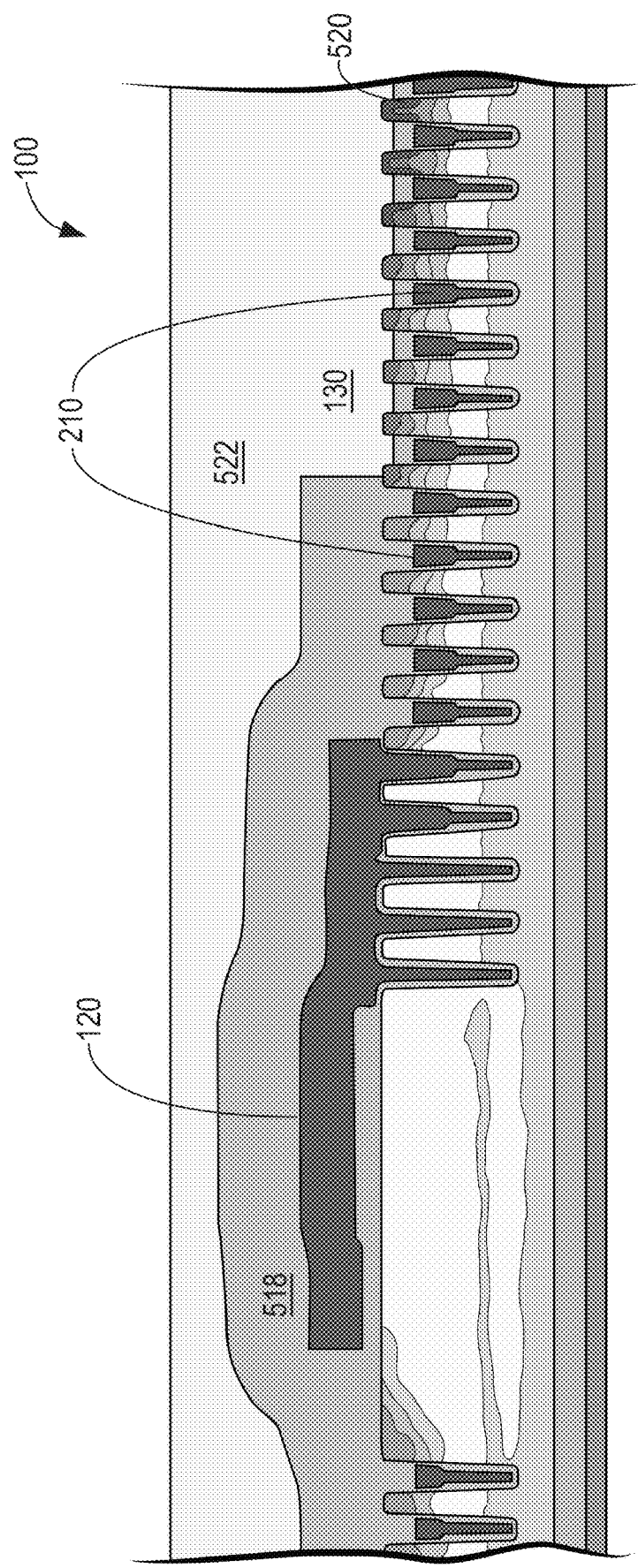

Referring to FIG. 5H, which is the same cross-sectional diagram of the trench-FET 100 as shown in FIG. 2, after the processing operations corresponding with FIG. 5G, an interlayer dielectric (ILD) 518 can be formed. Subsequent to forming the ILD 518, contact openings and contact metallization 130 can be formed, and a body 520 implant (e.g., p-type implant) can be performed. Further as shown in FIG. 5I, a source metal layer 522 can be formed (e.g., deposited and patterned), where the ILD 518 electrically isolates the polysilicon layer 120 and the gate (trench) electrodes 210 from the source metal layer 522. While not shown in FIG. 5, the example process can include signal pad and passivation (e.g., polyimide) formation.

Figure 6:
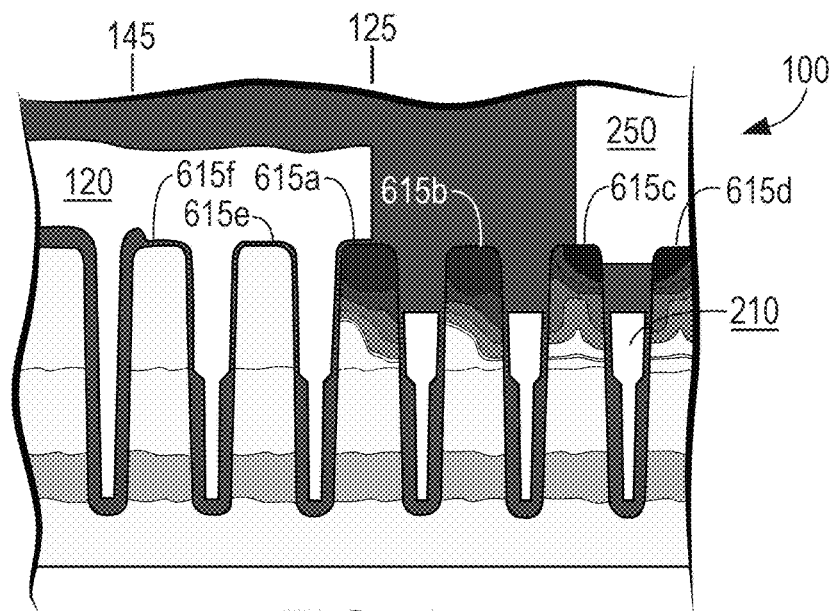
FIG. 6 is a diagram illustrating a cross-sectional view of a portion of a trench-FET, such as the trench-FET of FIGS. 1A and 1B.

FIG. 6 is a diagram illustrating a cross-sectional view of a portion of a trench-FET (e.g., the trench-FET 100). The portion of the trench-FET 100 shown in FIG. 6 illustrates (via simulation results) the effect of location of the edge 125 of the polysilicon layer 120. As shown in FIG. 6, the mesas 615a, 615b, 615c and 615d (at or outside the edge 125) are illustrated to show their respective doping profiles (e.g., including channel, body and/or source implants). As also shown in FIG. 6, the mesas 615e and 615f are shown as being of, in this example, N-type semiconductor (e.g., being formed from the semiconductor region in which the trench-FET 100 is disposed). In contrast, the mesas 615e and 615f do not include any additional doping (e.g., exclude channel doping, body doping and source doping), as would also be the case with an associated termination extension disposed under the polysilicon layer 120 (e.g., inside the edge 125). This arrangement, along with location of the SSO edge 145, as shown in FIG. 6, can help prevent breakdown voltage degradation and/or increases in leakage in an associated trench-FET 100, such as by using the approaches as described herein.

Figure 7:
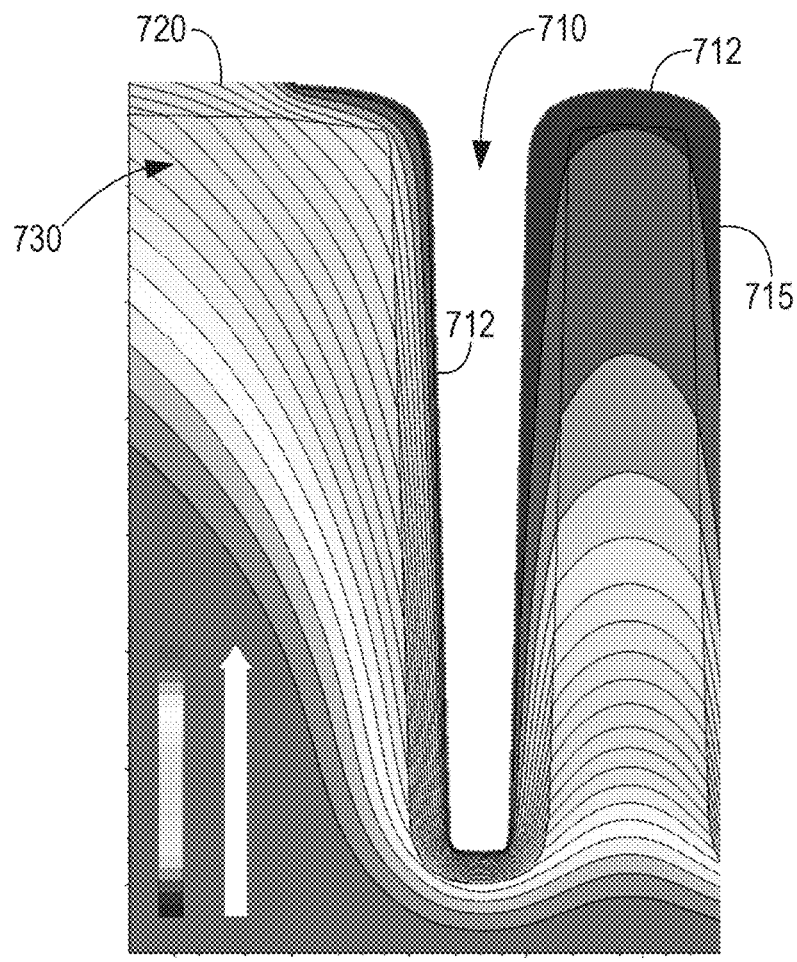
FIG. 7 is a diagram illustrating electrostatic potential curves for a trench-FET, such as the trench-FET of FIGS. 1A and 1B.

FIG. 7 is a diagram illustrating electrostatic potential curves (e-potential curves 730) for a trench-FET, such as the trench-FETs described. Specifically, FIG. 7 illustrates simulated e-potential curves 730 associated with an end trench 710 that is adjacent to (e.g., directly adjacent to, in contact with, etc.) a termination extension 720, such as in the trench-FET implementations described herein. Further, the simulation results of FIG. 7 were obtained based on a simulation where a p-type layer, in this example, was excluded (e.g., blocked by a polysilicon layer) from the termination extension 720. In other implementations, a termination extension and an associated semiconductor region can be p-type, an associated termination extension can exclude an n-type implant.

The simulated e-potential curves 730 of FIG. 7 were obtained based on a simulating where the end trench 710 was lined with a shield (thick) dielectric 712, as well with shield dielectric 712 disposed on top of a mesa 715 (e.g., on a trench tip) adjacent to the end trench 710. FIG. 7 includes a legend that indicates normalized increasing e-potentials. As can be seen from the simulation results in FIG. 7, which correspond with operation of an associated trench-FET in an off-state (e.g., with a drain voltage of 24V applied), there is little to no bending of the e-potential curves 730 in the termination extension 720. Accordingly, a termination structure including such an arrangement (such as the arrangement shown in, and described with respect to FIG. 7) can prevent reductions in breakdown voltages and/or increases in leakage in an associated trench FET, even when higher drain doping concentrations are used to reduce Rsp (e.g., in combination with SSO structures being implemented in associated active region trenches and/or active region trench portions to provide a shield plate effect).

In a general aspect, a trench-gate field-effect transistor (trench-FET) can include a semiconductor region of a first conductivity type (e.g., n-type) and a plurality of trenches defined within the semiconductor region. The plurality of trenches can be arranged in parallel with one another. The trench-FET can further include an active region including a portion of a first trench of the plurality of trenches, and a termination region at least partially surrounding the active region. The termination region can include a second trench of the plurality trenches, where the second trench can be disposed at an end of the plurality of trenches. The termination region can also include a termination extension of the first conductivity type disposed adjacent to the second trench. The termination extension can exclude a trench, and exclude an implant of a second conductivity type (e.g., p-type) opposite the first conductivity type. The portion of the first trench can have a dielectric material of a first thickness disposed on a bottom surface, a lower portion of a first sidewall, and a lower portion of a second sidewall of the first trench, where the second sidewall is opposite the first sidewall. The portion of the first trench can also have a dielectric material of a second thickness disposed on an upper portion of the first sidewall and an upper portion of the second sidewall, the first thickness being greater than the second thickness. The second trench can have the dielectric material of the first thickness disposed on a bottom surface and a first sidewall of the second trench, the first sidewall of the second trench being adjacent to the termination extension.

In another general aspect, a trench-FET can include a semiconductor region of a first conductivity type; and a plurality of trenches defined within the semiconductor region. The plurality of trenches can be arranged in parallel with one another. The trench-FET can also include an active region including a first portion of a first trench of the plurality of trenches and a termination region at least partially surrounding the active region. The termination region can include a second portion of the first trench and a third portion of the first trench. The first portion of the first trench can be disposed between the second portion of the first trench and the third portion of the first trench. The termination region can also include a termination extension of the first conductivity type disposed in the semiconductor region. The termination extension can include a first portion adjacent to the second portion of the first trench and a second portion adjacent to the third portion of the first trench. The first trench can be disposed between the first portion of the termination extension and the second portion of the termination extension. The termination extension can exclude a trench, and can exclude an implant of a second conductivity type opposite the first conductivity type. The first portion of the first trench can have a dielectric material of a first thickness disposed on a bottom surface, a lower portion of a first sidewall, and a lower portion of a second sidewall of the first trench, the second sidewall being opposite the first sidewall; and a dielectric material of a second thickness disposed on an upper portion of the first sidewall and an upper portion of the second sidewall, the first thickness being greater than the second thickness. The second portion and the third portion of the first trench can have the dielectric material of the first thickness disposed on respective bottom surfaces, respective first sidewalls and respective second sidewalls of the first trench.

It will be understood that, in the foregoing description, when an element, such as a layer, a region, or a substrate, is referred to as being on, adjacent to, connected to, electrically connected to, coupled to, or electrically coupled to another element, it may be directly on, adjacent to, connected or coupled to the other element, or one or more intervening elements may be present. In contrast, when an element is referred to as being directly on, directly adjacent to, directly connected to or directly coupled to another element or layer, there are no intervening elements or layers present. Although the terms directly on, directly adjacent to, directly connected to, or directly coupled to may not be used throughout the detailed description, elements that are shown as being directly on, directly adjacent, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, adjacent to and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to or horizontally adjacent to.

The various apparatus and techniques described herein may be implemented using various semiconductor processing and/or packaging techniques. Some embodiments may be implemented using various types of semiconductor processing techniques associated with semiconductor substrates including, but not limited to, for example, silicon (Si), gallium arsenide (GaAs), silicon carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A trench-gate field-effect transistor (trench-FET) comprising:
    a semiconductor region of a first conductivity type;
    a plurality of trenches defined within the semiconductor region, the plurality of trenches being arranged in parallel with one another;
    an active region including a portion of a first trench of the plurality of trenches; and
    a termination region at least partially surrounding the active region, the termination region including:
        a second trench of the plurality of trenches, the second trench being disposed at an end of the plurality of trenches; and
        a termination extension of the first conductivity type disposed adjacent to the second trench, the termination extension excluding a trench, and excluding an implant of a second conductivity type opposite the first conductivity type,
    the portion of the first trench having:
        a dielectric material of a first thickness disposed on a bottom surface, a lower portion of a first sidewall, and a lower portion of a second sidewall of the first trench, the second sidewall being opposite the first sidewall; and
        a dielectric material of a second thickness disposed on an upper portion of the first sidewall and an upper portion of the second sidewall, the first thickness being greater than the second thickness; and
    the second trench having the dielectric material of the first thickness disposed on a bottom surface and a first sidewall, the first sidewall of the second trench being adjacent to the termination extension.

2. The trench-FET of claim 1, further comprising a polysilicon layer disposed on the termination extension and over the second trench, an edge of the polysilicon layer being disposed on a semiconductor mesa defined between two adjacent trenches of the plurality of trenches.

3. The trench-FET of claim 2, wherein the edge of the polysilicon layer is disposed on a mesa of the semiconductor region that is disposed between the second trench and a third trench of the plurality of trenches,
    the third trench being disposed adjacent to the second trench, and disposed between the first trench and the second trench.

4. The trench-FET of claim 2, wherein the edge of the polysilicon layer is disposed on a mesa of the semiconductor region that is disposed between the first trench and a third trench of the plurality of trenches,
    the third trench being disposed adjacent to the first trench, and disposed between the first trench and the second trench, the polysilicon layer being further disposed over the third trench.

5. The trench-FET of claim 2, wherein the polysilicon layer is a gate feed for the trench-FET.

6. The trench-FET of claim 5, further comprising gate polysilicon disposed in the first trench and the second trench, the gate polysilicon being disposed on the dielectric material of the first thickness in the first trench, the dielectric material of the second thickness in the first trench, and the dielectric material of the first thickness in the second trench, the gate polysilicon being electrically coupled with the gate feed.

7. The trench-FET of claim 1, wherein:
    the dielectric material of the first thickness is a shield dielectric; and
    the dielectric material of the second thickness is a gate dielectric.

8. The trench-FET of claim 1, wherein the portion of the first trench is a first portion, the termination region further including:
    a second portion of the first trench having the dielectric material of the first thickness disposed on a bottom surface, a first sidewall and a second sidewall; and
    a third portion of the first trench having the dielectric material of the first thickness disposed on a bottom surface, a first sidewall and a second sidewall,
    the first portion of the first trench being disposed between the second portion of the first trench and the third portion of the first trench.

9. The trench-FET of claim 1, wherein the second trench further has the dielectric material of the first thickness disposed on a second sidewall, the second sidewall of the second trench being opposite the first sidewall of the second trench.

10. The trench-FET of claim 1, wherein the second trench further has the dielectric material of the first thickness disposed on a lower portion of a second sidewall, and the dielectric material of the second thickness disposed on an upper portion of the second sidewall, the second sidewall of the second trench being opposite the first sidewall of the second trench.

11. The trench-FET of claim 1, wherein the active region further includes a portion of a third trench of the plurality of trenches, the third trench being adjacent to the first trench, the portion of the third trench having:
the dielectric material of the first thickness disposed on a bottom surface, a lower portion of a first sidewall, and a lower portion of a second sidewall, the second sidewall of the third trench being opposite the first sidewall; and
the dielectric material of the second thickness disposed on an upper portion of the first sidewall and an upper portion of the second sidewall.

12. The trench-FET of claim 1, wherein the active region further includes a semiconductor mesa of the semiconductor region, the semiconductor mesa including a channel implant of the second conductivity type and a source implant of the first conductivity type, the semiconductor region including a drain region of the trench-FET.

13. The trench-FET of claim 1, wherein the termination region further includes a perimeter trench disposed around the plurality of trenches, the perimeter trench having the dielectric material of the first thickness disposed on a bottom surface, a first sidewall and a second sidewall, a portion of the perimeter trench being disposed between the second trench and the termination extension,
wherein a surface of the semiconductor region disposed between the perimeter trench and the plurality of trenches has the dielectric material of the first thickness disposed thereon.

14. The trench-FET of claim 1, wherein the termination region further includes a perimeter trench disposed around at least a portion of the plurality of trenches, the perimeter trench having the dielectric material of the first thickness disposed on a bottom surface, a first sidewall and a second sidewall, the second trench of the plurality of trenches being included in the perimeter trench.

15. A trench-gate field-effect transistor (trench-FET) comprising:
a semiconductor region of a first conductivity type;
a plurality of trenches defined within the semiconductor region, the plurality of trenches being arranged in parallel with one another;
an active region including a first portion of a first trench of the plurality of trenches; and
a termination region at least partially surrounding the active region, the termination region including:
a second portion of the first trench; and
a third portion of the first trench, the first portion of the first trench being disposed between the second portion of the first trench and the third portion of the first trench; and
a termination extension of the first conductivity type disposed in the semiconductor region, the termination extension including:
a first portion adjacent to the second portion of the first trench; and
a second portion adjacent to the third portion of the first trench,
the first trench being disposed between the first portion of the termination extension and the second portion of the termination extension, and
the termination extension excluding a trench, and excluding an implant of a second conductivity type opposite the first conductivity type,
the first portion of the first trench having:
a dielectric material of a first thickness disposed on a bottom surface, a lower portion of a first sidewall, and a lower portion of a second sidewall of the first trench, the second sidewall being opposite the first sidewall; and
a dielectric material of a second thickness disposed on an upper portion of the first sidewall and an upper portion of the second sidewall, the first thickness being greater than the second thickness; and
the second portion and the third portion of the first trench having the dielectric material of the first thickness disposed on respective bottom surfaces, respective first sidewalls and respective second sidewalls of the first trench.

16. The trench-FET of claim 15, wherein the termination region further includes a second trench of the plurality of parallel arranged trenches, the second trench being disposed at an end of the plurality of parallel arranged trenches, the second trench having the dielectric material of the first thickness disposed on a bottom surface and a first sidewall of the second trench, the first sidewall of the second trench being adjacent to a third portion of the termination extension.

17. The trench-FET of claim 15, further comprising a perimeter trench disposed around the plurality of parallel arranged trenches, the perimeter trench having the dielectric material of the first thickness disposed on a bottom surface, a first sidewall and a second sidewall, a first portion of the perimeter trench being disposed between the first trench and the first portion of the termination extension, and a second portion of the perimeter trench being disposed between the first trench and the second portion of the termination extension,
wherein a surface of the semiconductor region disposed between the perimeter trench and the plurality of parallel arranged trenches has the dielectric material of the first thickness disposed thereon.

18. The trench-FET of claim 15, further comprising a polysilicon layer disposed on the termination extension and over the first trench, an edge of the polysilicon layer being disposed on a semiconductor mesa disposed between two adjacent trenches of the plurality of trenches.

19. A trench-gate field-effect transistor (trench-FET) comprising:
a semiconductor region of a first conductivity type;
a plurality of trenches defined within the semiconductor region, the plurality of trenches being arranged in parallel with one another;
an active region including a portion of a first trench of the plurality of trenches; and
a termination region at least partially surrounding the active region, the termination region including:
a second trench of the plurality of trenches, the second trench being disposed at an end of the plurality of trenches; and
a termination extension of the first conductivity type disposed adjacent to the second trench, the termination extension excluding a trench, and excluding an implant of a second conductivity type opposite the first conductivity type,
the portion of the first trench having:
a dielectric material of a first thickness disposed on a bottom surface, a lower portion of a first sidewall, and a lower portion of a second sidewall of the first trench, the second sidewall being opposite the first sidewall; and a dielectric material of a second thickness disposed on an upper portion of the first sidewall and an upper portion of the second sidewall, the first thickness being greater than the second thickness;

the second trench having the dielectric material of the first thickness disposed on a bottom surface, a first sidewall and a second sidewall of the second trench, the first sidewall of the second trench being adjacent to, and in contact with the termination extension, the second sidewall of the second trench being opposite the first sidewall of the second trench;

a third trench of the plurality of parallel arranged trenches that is adjacent to the first trench, the active region further including a portion of the third trench, the third trench being disposed between the first trench and the second trench; and a polysilicon layer disposed on the termination extension, over the second trench and over the third trench, an edge of the polysilicon layer being disposed on a semiconductor mesa defined between the first trench and the third trench.

20. The trench-FET of claim 19, wherein the portion of the third trench included in the active region has:

the dielectric material of a first thickness disposed on a bottom surface, a lower portion of a first sidewall, and a lower portion of a second sidewall, the second sidewall being opposite the first sidewall; and the dielectric material of a second thickness disposed on an upper portion of the first sidewall and an upper portion of the second sidewall, the first thickness being greater than the second thickness.

* * * * *